(12) United States Patent
Lin et al.

(10) Patent No.: US 9,478,498 B2
(45) Date of Patent: Oct. 25, 2016

(54) THROUGH PACKAGE VIA (TPV)

(71) Applicant: Taiwan Semiconductor Manufacturing Company, Ltd., Hsin-Chu (TW)

(72) Inventors: Jing-Cheng Lin, Hsin-Chu (TW); Po-Hao Tsai, Zhongli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 138 days.

(21) Appl. No.: 13/959,378

(22) Filed: Aug. 5, 2013

(65) Prior Publication Data

US 2015/0035146 A1     Feb. 5, 2015

(51) Int. Cl.
| | |
|---|---|
| *H01L 23/538* | (2006.01) |
| *H01L 23/00* | (2006.01) |
| *H01L 25/10* | (2006.01) |
| *H01L 23/498* | (2006.01) |
| *H01L 25/065* | (2006.01) |

(52) U.S. Cl.
CPC ..... *H01L 23/5389* (2013.01); *H01L 23/49811* (2013.01); *H01L 24/19* (2013.01); *H01L 24/97* (2013.01); *H01L 25/105* (2013.01); *H01L 24/24* (2013.01); *H01L 24/82* (2013.01); *H01L 25/0657* (2013.01); *H01L 2224/04105* (2013.01); *H01L 2224/12105* (2013.01); *H01L 2224/131* (2013.01); *H01L 2224/24101* (2013.01); *H01L 2224/24227* (2013.01); *H01L 2224/25171* (2013.01); *H01L 2224/32145* (2013.01); *H01L 2224/32225* (2013.01); *H01L 2224/48227* (2013.01); *H01L 2224/73267* (2013.01); *H01L 2224/82005* (2013.01); *H01L 2224/92224* (2013.01); *H01L 2224/92244* (2013.01); *H01L 2224/97* (2013.01); *H01L 2225/0651* (2013.01); *H01L 2225/06568* (2013.01); *H01L 2225/1035* (2013.01); *H01L 2225/1058* (2013.01); *H01L 2225/1082* (2013.01); *H01L 2924/12042* (2013.01); *H01L 2924/15311* (2013.01); *H01L 2924/181* (2013.01)

(58) Field of Classification Search
CPC ................. H01L 2924/01079; H01L 23/051; H01L 2924/01029; H01L 2924/01013; H01L 2924/01078; H01L 2224/13099; H01L 23/5389; H01L 23/49811; H01L 24/97; H01L 25/105; H01L 24/19; H01L 2224/131; H01L 2224/04105; H01L 24/82; H01L 24/24; H01L 2224/24101; H01L 2224/25171; H01L 2224/82005; H01L 2224/24227
See application file for complete search history.

(56) References Cited

U.S. PATENT DOCUMENTS

| | | | |
|---|---|---|---|
| 5,994,166 A * | 11/1999 | Akram et al. ................ 438/108 |
| 6,548,897 B2 * | 4/2003 | Grigg ............................ 257/737 |
| 2002/0100973 A1* | 8/2002 | Akram et al. ................ 257/734 |
| 2002/0115279 A1* | 8/2002 | Farnworth ............ H01L 21/288 |
| | | | 438/613 |

(Continued)

FOREIGN PATENT DOCUMENTS

| | | |
|---|---|---|
| KR | 100659527 | 12/2006 |
| KR | 1020070076846 | 7/2007 |

*Primary Examiner* — Michelle Mandala
(74) *Attorney, Agent, or Firm* — Slater Matsil, LLP

(57) ABSTRACT

A through package vias (TPV), a package including a plurality of the TPVs, and a method of forming the through package via are provided. Embodiments of a through package via (TPV) for a package include a build-up film layer, a metal pad disposed over the build-up film layer, a polymer ring disposed over the metal pad, and a solder feature electrically coupled with the metal pad.

20 Claims, 6 Drawing Sheets

(56) References Cited

U.S. PATENT DOCUMENTS

| | | | |
|---|---|---|---|
| 2005/0070083 A1* | 3/2005 | Johnson et al. | 438/612 |
| 2005/0087885 A1 | 4/2005 | Jeong | |
| 2006/0244117 A1* | 11/2006 | Karnezos et al. | 257/678 |
| 2007/0145548 A1* | 6/2007 | Park et al. | 257/678 |
| 2008/0157331 A1* | 7/2008 | Onodera | H01L 21/563 257/686 |
| 2009/0294942 A1 | 12/2009 | Palmer et al. | |
| 2010/0213598 A1* | 8/2010 | Liu | H01L 21/563 257/690 |
| 2010/0246152 A1* | 9/2010 | Lin et al. | 361/783 |
| 2011/0156251 A1* | 6/2011 | Chu | H01L 23/3128 257/738 |
| 2014/0099755 A1* | 4/2014 | Cheng | H01L 24/81 438/124 |

\* cited by examiner

THROUGH PACKAGE VIA (TPV)

BACKGROUND

As the demand for smaller electronic products grows, manufacturers and others in the electronics industry continually seek ways to reduce the size of integrated circuits used in the electronic products. In that regard, three-dimensional (3D) type integrated circuit (IC) packaging techniques have been developed and used.

One packaging technique that has been developed is Package-on-Package (PoP). As the name implies, PoP is a semiconductor packaging innovation that involves stacking one package on top of another package. A PoP device may combine vertically discrete memory and logic packages.

Through package vias (TPVs) are a useful component in the creation of 3D packages and 3D ICs. TPVs permit designers to replace the edge wiring when creating 3D packages (e.g., System in Package, Chip Stack Multi-chip Module).

By using TPVs, designers of 3D packages or 3D ICs are able to reduce the size of the IC or package, e.g. Miniaturization. This is due to the reduced, or eliminated, need for edge wiring as well as the ability to double-side mount both types of active circuits, logic and memory.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the disclosure provides many applicable inventive concepts that can be embodied in a wide variety of specific contexts. The specific embodiments discussed are merely illustrative and do not limit the scope of the disclosure.

The present disclosure will be described with respect to embodiments in a specific context, namely a three dimensional (3D), integrated fan-out (InFO) through package via (TPV) within a package suitable for inclusion in a package-on-package (PoP) device. The concepts in the disclosure may also apply, however, to other semiconductor structures or circuits.

Figure 1:
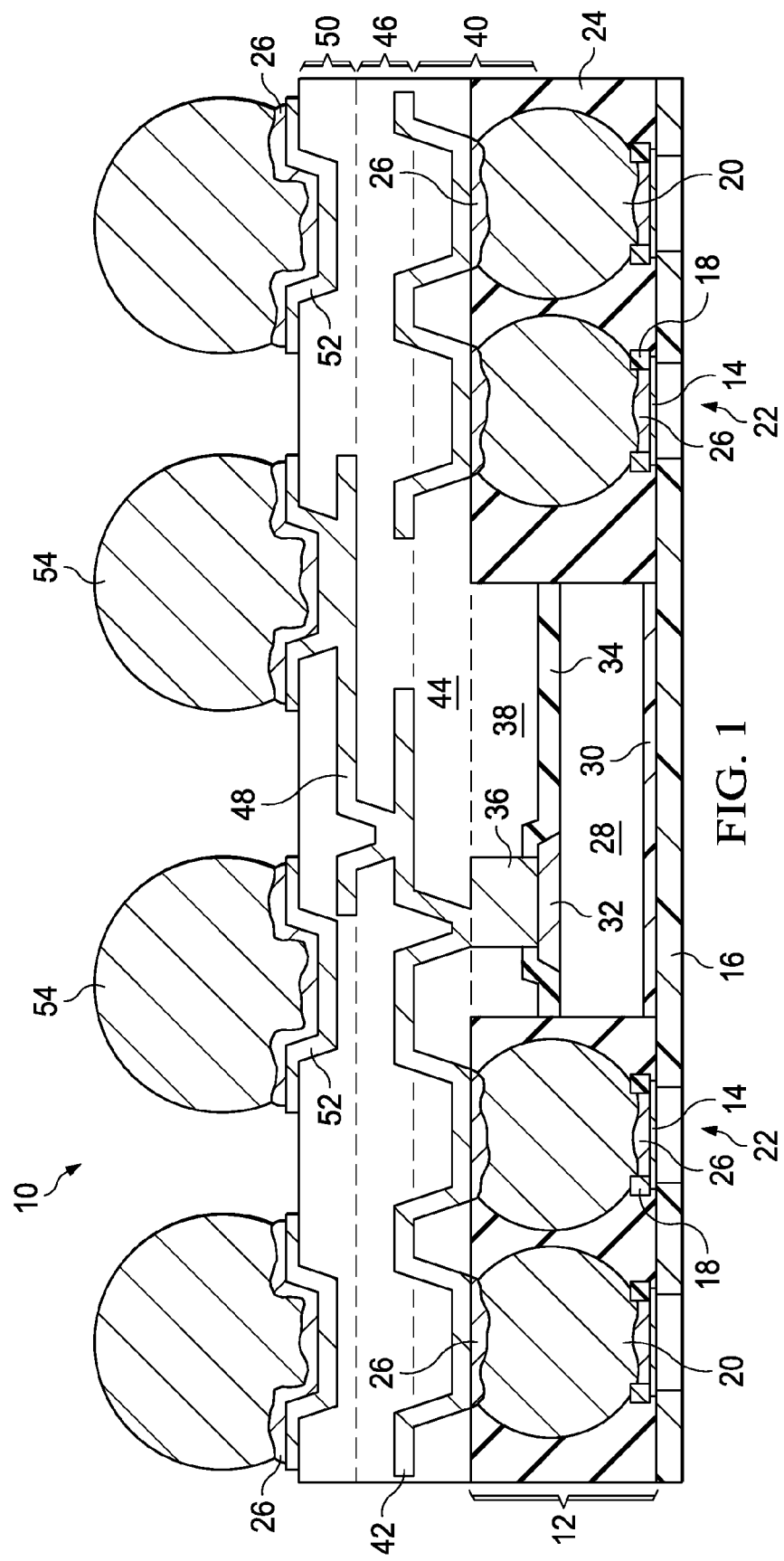
FIG. 1 is a cross section diagram of a package having through package vias (TPVs)

Referring now to FIG. 1, a package 10 suitable for use in a package-on-package (PoP) device is illustrated. As shown, the package 10 includes several through package vias (TPVs) 12. As will be more fully explained below, the through package vias 12 in the package 10 of FIG. 1 offer significant advantages relative to traditional copper vias formed by conventional plating techniques. For example, the through package vias 12 in FIG. 1 limit or prevent height variations often found in copper vias formed using a plating process. Such height variations may lead to an undesirable yield loss. Moreover, the through package vias 12 in FIG. 1 are less expensive to manufacture than traditionally formed copper vias, which include a substantial amount of copper, the deposition of which is a costly process.

While four of the through package vias 12 are depicted in FIG. 1, it should be recognized that more or fewer of the vias may be included in other embodiments. In various embodiments, each of the through package vias 12 in the package 10 includes a metal pad 14 disposed over a build-up film layer 16, a polymer ring 18, and a solder feature 20. In various embodiments, the build-up film layer 16 comprises an Ajinomoto build-up film (ABF) layer. However, in various embodiments the build-up film layer 16 may be formed from other suitable film layer materials.

As shown in FIG. 1, the metal pad 14 is generally disposed above the build-up film layer 16. In various embodiments, each of the metal pads 14 is disposed over, and extends across, a recess 22 in the build-up film layer 16. As such, the metal pad 14 and the recess 22 are generally vertically oriented or aligned with each other as shown in FIG. 1. Still referring to FIG. 1, each of the recesses 22 exposes a portion of the underside (as oriented in FIG. 1) of the corresponding metal pad 14. In various embodiments, the metal pad 14 is formed from copper. However, in various embodiments the metal pad 14 may be formed from other suitable metals or electrically conductive materials (e.g., aluminum (Al), titanium (Ti), Tungsten (W), and combinations thereof).

The polymer ring 18 in each of the through package vias 12 is generally disposed over the metal pad 14. In various embodiments, the polymer ring 18 comprises polybenzoxazole (PBO). However, in another embodiment the polymer ring 18 may be formed from another suitable polymer or material (e.g., polyimide, epoxy, etc.) In various embodiments, the top surface of the polymer ring 18 engages the solder feature 20. In addition, in various embodiments the polymer ring 18 overhangs the metal pad 14 in a horizontal or lateral direction. As shown in FIG. 1, in various embodiments the polymer ring 18 is at least partially encapsulated by a molding compound 24.

The solder feature 20 is generally disposed over the polymer ring 18. In various embodiments, the solder feature 20 is mounted or seated in the polymer ring 18. As such, the polymer ring 18 restricts or prohibits the solder feature 20 from lateral movement during the package 10 formation or manufacturing process. In various embodiments, the solder feature 20 is a solder ball. However, in various embodiments the solder feature 20 may be another suitable solder component or electrically conductive material.

Still referring to FIG. 1, in various embodiments an intermetallic compound (IMC) 26 is disposed between the solder feature 20 and the metal pad 14 within the polymer ring 18. As will be more fully explained below, the intermetallic compound 26 is a product of a reflow process used to electrically couple the solder feature 20 and the metal pad 14.

In various embodiments, the width of the solder feature 20 (in a lateral direction as oriented in FIG. 1) is greater than the width of the underlying polymer ring 18. In addition, the width of the polymer ring 18 is greater than the width of the underlying metal pad 14. However, in various embodiments the solder feature 20, the polymer ring 18, and/or the metal pad 14 may have other dimensions relative to one another.

In other words, the size and shape of the solder feature 20, the polymer ring 18, and/or the metal pad may be altered or manipulated to, for example, suitably operate or function within the package 10.

In addition to the through package vias 12, the embodiment package 10 of FIG. 1 includes a first die 28. As shown, the first die 28 is generally secured to the build-up film layer 16 by a die attach film (DAF) 30. In various embodiments, the first die 28 is a logic device or logic component (a logic integrated circuit, analog circuit, and so on).

Still referring to FIG. 1, an aluminum pad 32 (or other suitable metal pad) is generally disposed on the first die 28. As shown, the metal pad 14 is partially covered by a passivation layer 34 having a recess occupied by a copper connection 36 (e.g., copper stud) passing through the bottom portion 38 of a first polymer layer 40.

The copper connection 36 is generally electrically coupled to a first redistribution layer 42 disposed in a top portion 44 of the first polymer layer 40 and a second polymer layer 46. As shown, the first redistribution layer 42 is in electrical communication with the solder feature 20 in each of the through package vias 12. In various embodiments, more of the intermetallic compound 26 is formed where the solder feature 20 and the first redistribution layer 42 engage each other.

Still referring to FIG. 1, a second redistribution layer 48 is disposed in the second polymer layer 46 and a third polymer layer 50. As shown, the second redistribution layer 48 includes or is in electrical communication with under bump metallization (UBM) 52 suitable to receive additional solder features 54 (e.g., solder balls) or other electrically conductive components. As shown, the intermetallic compound 26 is present between the solder features 54 and the under bump metallization 52. The solder features 54 may be used to secure and electrically couple the package 10 to, for example, a printed circuit board (not shown).

Figure 2A:
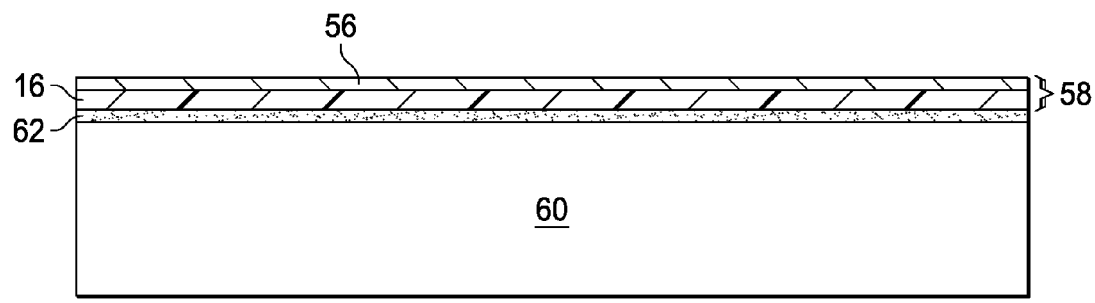
FIGS. 2A-2M are collectively schematics of a process flow used to manufacture a package on package (PoP) device having the TPVs of FIG. 1.

FIGS. 2A-2M collectively schematically illustrate a process flow used to manufacture a package on package (PoP) device including the package 10 with the through package vias 12 as shown in FIG. 1. In FIG. 2A, a build-up film layer 16 supporting a copper layer 56 (which may be collectively referred to as a buffer layer 58) is secured to a carrier 60 using an adhesive 62 (e.g., glue). Notably, the adhesive 62, the build-up film layer 16, and the copper layer 56 are sequentially formed over the carrier 60. In some embodiments, the copper layer 56 is deposited or formed upon the build-up film layer 16 through, for example, physical vapor deposition (PVD), chemical vapor deposition (CVD), electroless plating, copper foil laminating, and so on.

Figure 2B:
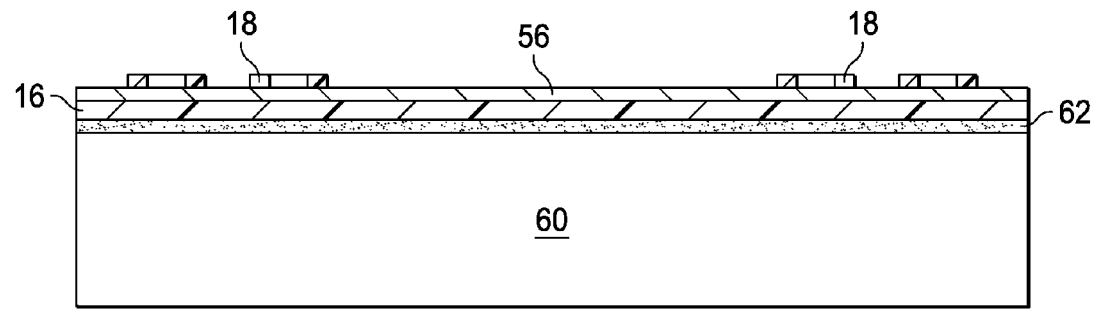
Figure 2C:
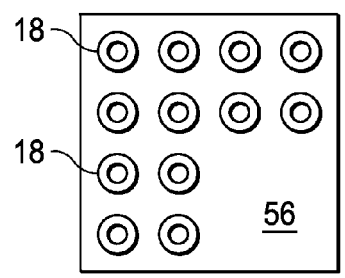

Next, as shown in FIG. 2B, a polymer layer is disposed or deposited over the copper layer 56 and patterned to form a plurality of the polymer rings 18 as shown in FIG. 2C. In some embodiments, the polymer layer comprises a polybenzoxaxole (PBO), a polyimide, an epoxy, an so on. The polymer layer may be formed or deposited by chemical vapor deposition (CVD), spin coating, laminating, and so on.

In various embodiments, the polymer rings 18 are generally arranged in a symmetrical pattern when viewed from above. For example, the polymer rings 18 may be organized into horizontal columns and vertical rows (as oriented in FIG. 2C), lines, groups, and so on, over the surface of the chip. However, the polymer rings 18 may be otherwise arranged in other embodiments. In addition, in some embodiments the polymer rings 18 may actually be non-circular or non-ring shaped (e.g., square, rectangular, etc.). Also, in some embodiments the polymer rings 18 may be non-continuous or broken such that they look like, for example, dashed lines when viewed from above.

Figure 2D:
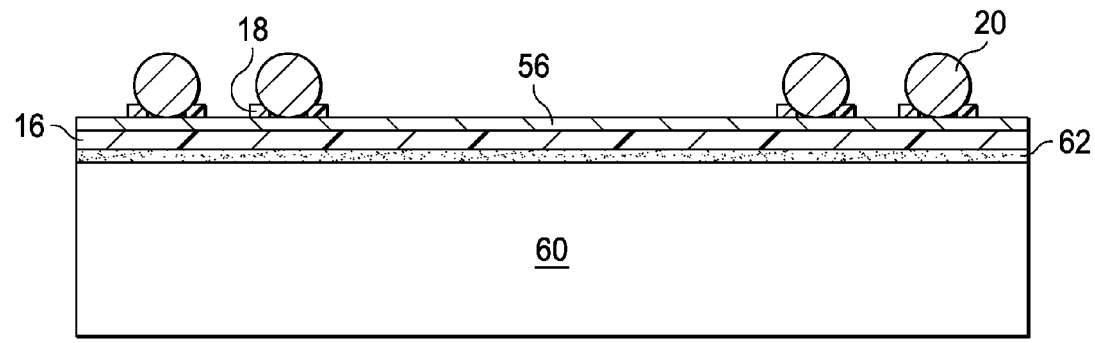

Referring now to FIG. 2D, the solder feature 20 (e.g., solder ball) is disposed or mounted in each of the polymer rings 18 and a reflow process is performed to electrically connect and mechanically secure the solder features 20. As noted above, the intermetallic compound 26 is a product of the reflow process used to electrically couple the solder feature 20 and the metal pad 14. In particular, the intermetallic compound 26 is a mixture of a portion of the solder feature 20 and a portion of the metal pad 14 where the electrical connection was formed. In some cases, the shape of the solder features 20 changes as a result of the reflow process.

Figure 2E:
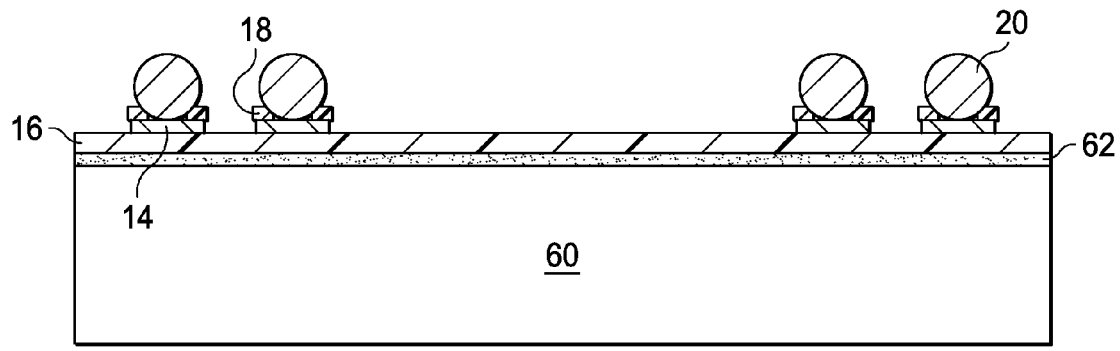

Next, as shown in FIG. 2E, an etch process is performed to etch away portions of the metal layer 56 (FIG. 2A). In various embodiments, the etch process removes a portion of the metal layer 56 disposed beyond a periphery of each of the polymer rings 18 to form the metal pad 14 beneath each of the polymer rings 18. In an embodiment, no extra protection is needed for the solder ball due to the high chemical etch selection. In some embodiments, the etch process is performed such that a portion of the metal layer 56 is removed from beneath the polymer rings 18. In other words, the polymer rings 18 overhang the metal layer 56 remaining after the etching process. In some embodiments, the metal layer 56 is etched using, for example, a dry etch, a wet etch, a plasma etch, a reactive ion etch, (RIE), and so on.

Figure 2F:
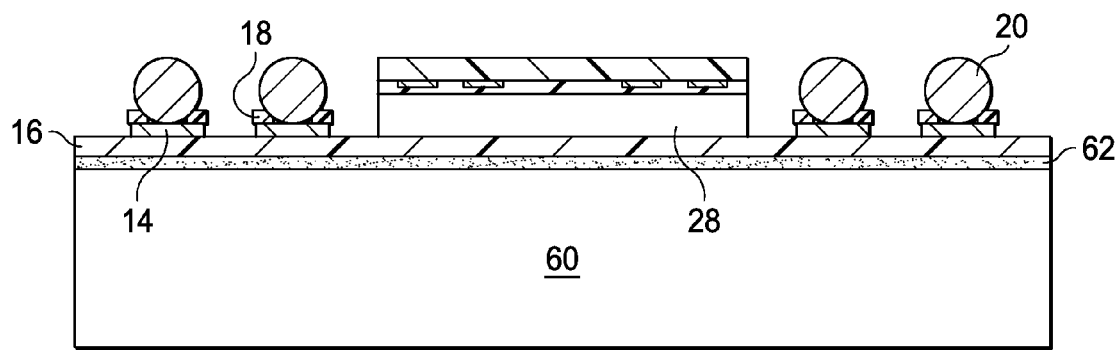
Figure 2G:
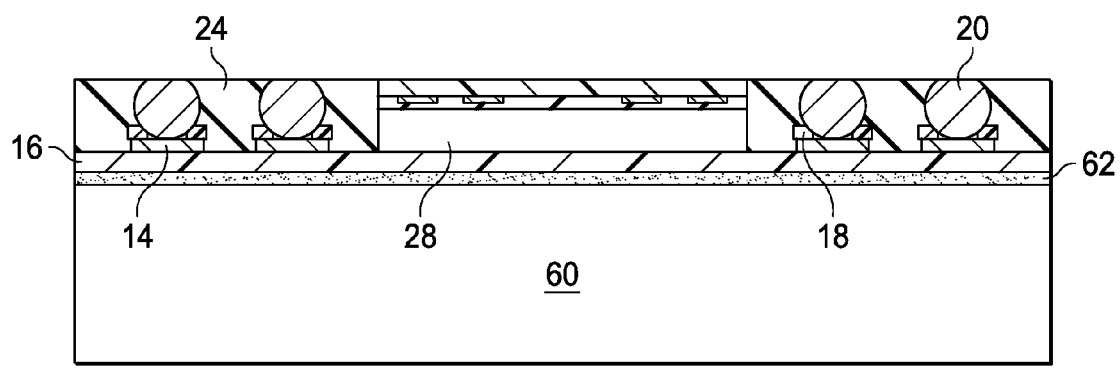

As shown in FIG. 2F, the first die 28 is placed and secured using the die attach film 30. The first die 28 may be placed using any suitable or conventional die placement methods. Next, the molding compound 24 is formed over, around, and on the solder features 20, the polymer rings 18, the metal pads 14, the first die 28, and the build-up film 16. Thereafter, a grinding process exposes the first die 28 and the solder features 20 and planarizes the upper surface of the molding compound 24, as shown in FIG. 2G. In an embodiment, the first die 28 may be a combination of logic, memory, interconnects, and so on. As such, the first die 28 in FIG. 2G is depicted as several layers coupled by wire bonding, interconnects, vias, or suitable metallization.

Figure 2H:
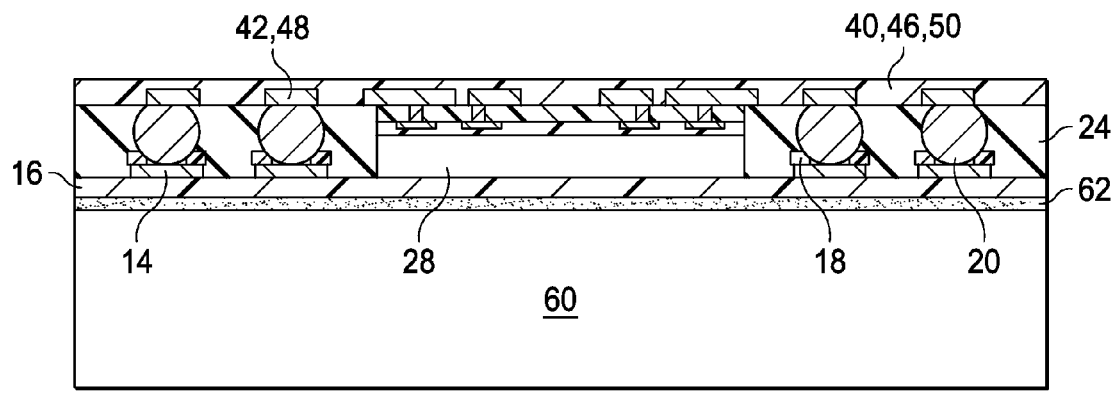

Referring now to FIG. 2H, the polymer layers 40, 46, 50 and the redistribution layers 42, 48 are formed over the solder features 20 and the first die 28. Notably, in FIG. 2H a simplified version of the device from FIG. 1 is depicted for ease of illustration. In other words, some of the structures of FIG. 1 have been omitted from FIG. 2H. In addition, several processed used to form the device in FIGS. 1 and 2H in practical applications have not been discussed in detail as they are not needed for a full and complete understanding of the inventive concept herein.

Figure 2I:
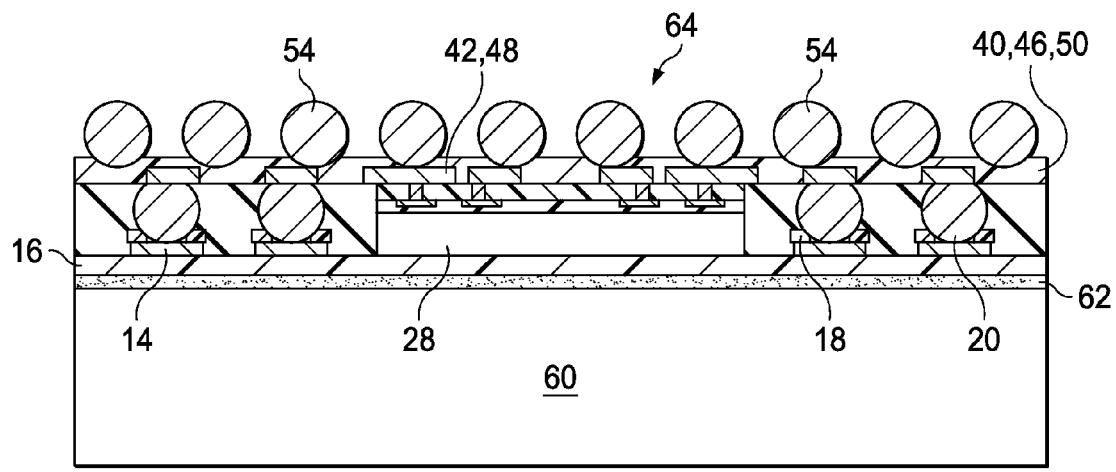

Next, as shown in FIG. 2I, the additional solder features 54 (e.g., solder balls) are mounted and electrically coupled to the redistribution layers 42, 48 though, for example, the under bump metallization 52 (FIG. 1). In various embodiments, the device 64 is tested after the additional solder features 54 have been mounted.

Figure 2J:
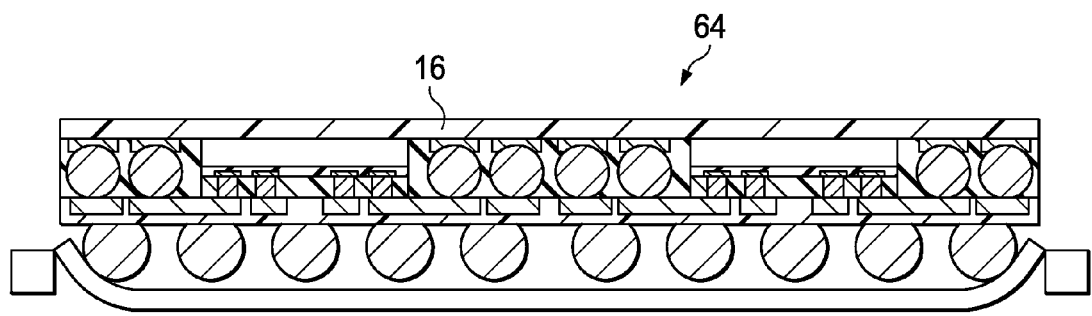
Figure 2K:
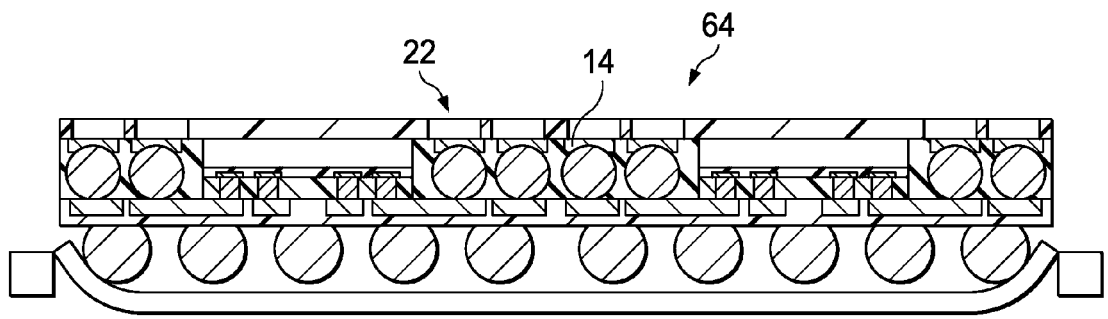

Referring now to FIG. 2J, the device 64 is flipped over and de-bonded from the carrier 60 (FIGS. 2A-2I). In some embodiments, there is tape protection disposed over the additional solder features 54. Once the device 64 has been de-bonded from the carrier 60, in various embodiments a laser drill or other suitable device or process may be used to optionally form the recesses 22 in the device 64 as shown in FIG. 2K. As shown, when formed the recesses 22 generally expose the metal pads 14.

Figure 2L:
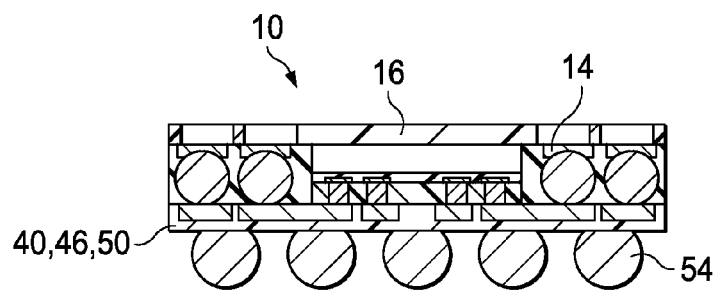
Figure 2M:
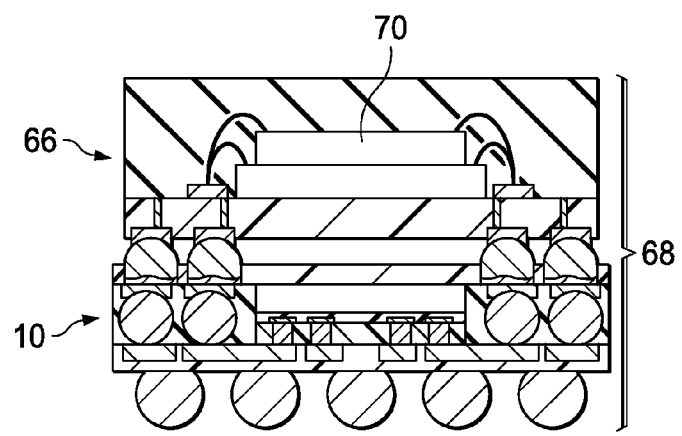

Referring now to FIG. 2L, a die saw (not shown) is used to separate individual packages 10 in the device 64 from each other. In various embodiments, a solder paste may be optionally deposited over the exposed metal pads 14. Thereafter, as shown in FIG. 2M, a second package 66 is mounted onto the underlying package 10 to form a package-on-package (PoP) device 68. As shown, the second package 66 includes one or more second dies 70. In various embodiments, the second dies 70 may be vertically discrete memory components electrically coupled to the first package 10 through, for example, wire bonding.

Figure 3:
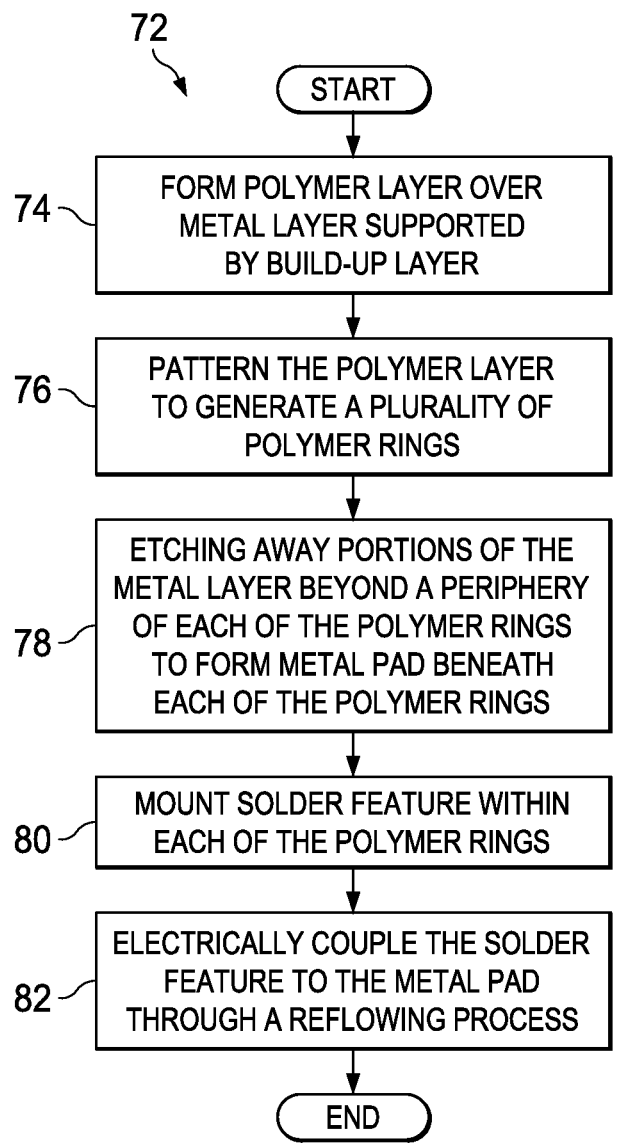
FIG. 3 is a flow chart of a method of forming the PoP device of FIG. 2.

Referring now to FIG. 3, a method 72 of forming the through package via 10 of, for example, FIG. 1 is illustrated. In block 74, a polymer layer is formed over a metal layer, which is supported by a build-up film layer on a carrier. As noted above, the polymer layer may be formed from polyimide, epoxy, or another suitable material using a variety of suitable formation or deposition processes.

In block 76, the polymer layer is patterned to generate a plurality of polymer rings. The polymer rings may be continuous and unbroken, or may be in segments and discontinuous around their periphery. In addition, the polymer rings may take a variety of different shapes other than round or circular.

In block 78, a solder feature is mounted within each of the polymer rings. The solder feature may be a solder ball. In block 80, portions of the metal layer beyond a periphery of each of the polymer rings are etched away to form a metal pad beneath each of the polymer rings. In block 82, the solder feature is electrically coupled to the metal pad through a reflowing process. During the re-flow process, intermetallic compounds may be formed and the shape of the solder feature may change.

From the foregoing it should be recognized that the through package vias disclosed herein offer significant advantages relative to copper vias formed by conventional plating techniques. For example, the through package vias limit or prevent height variations often found in copper vias formed using the plating process. Such height variations can lead to an undesirable yield loss. Moreover, the through package vias are less expensive than copper vias formed through the traditional plating process.

A through package via (TPV) for a package including a metal pad disposed over a build-up film layer, a polymer ring disposed over the metal pad, and a solder feature electrically coupled with the metal pad.

A package on package (PoP) device including a first package supporting a first die and a second package electrically coupled to the first package and supporting a second die, the second package incorporating a plurality of through package vias (TPVs), each of the through package vias including a solder feature mounted in a polymer ring disposed over a metal pad supported by a build-up film layer.

A method of forming a through package via (TPV) for a package including forming a polymer layer over a metal layer supported by a build-up film layer, patterning the polymer layer to generate a plurality of polymer rings, mounting a solder feature within each of the polymer rings, etching away portions of the metal layer beyond a periphery of each of the polymer rings to form a metal pad beneath each of the polymer rings, and electrically coupling the solder feature to the metal pad through a reflowing process.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A device comprising:
 a die having a first surface and a second surface opposite the first surface;
 a metal pad having a third surface and a fourth surface opposite the third surface;
 an encapsulant along sidewalls of the die, the encapsulant having a fifth surface and a sixth surface opposite the fifth surface, the fifth surface of the encapsulant being level with the first surface of the die and the third surface of the metal pad, the fifth surface of the encapsulant extending from die to the metal pad, the encapsulant not extending over the first surface of the die and the third surface of the metal pad;
 a polymer ring disposed over fourth surface of the metal pad; and
 a solder feature electrically coupled with the metal pad, the solder feature being coupled to the metal pad and extending to the sixth surface of the encapsulant.

2. The device of claim 1, wherein the polymer ring comprises polybenzoxaxole (PBO).

3. The device of claim 1, wherein a first surface of the polymer ring engages the solder feature and a second surface of the polymer ring engages the metal pad.

4. The device of claim 1, wherein the polymer ring is at least partially encapsulated by the encapsulant.

5. The device of claim 1, wherein the polymer ring overhangs the metal pad.

6. The device of claim 1, wherein the solder feature is mounted in the polymer ring.

7. The device of claim 1, wherein an intermetallic compound is disposed between the metal pad and the solder feature and within the polymer ring.

8. The device of claim 1, further comprising:
 a dielectric layer extending over a surface of the encapsulant and the metal pad, the dielectric layer having a recess, the recess vertically aligned with the polymer ring and the metal pad.

9. The device of claim 8, wherein the dielectric layer comprises a build-up film layer and the metal pad comprises copper, and the solder feature comprises a solder ball, the solder ball laterally adjacent to the die.

10. A device comprising:
 a first package, the first package comprising a first die;
 a second package electrically coupled to the first package, the second package comprising a second die, a molding compound extending along sidewalls of the second die, die; and
 a plurality of through package vias (TPVs) extending through the molding compound, each of the through package vias including a solder feature mounted in a polymer ring disposed over a metal pad, a first surface of the molding compound extending from a first sidewall of the second die to a second sidewall of the metal pad, the molding compound being interposed between the first sidewall and the second sidewall, the first surface of the molding compound, a surface of the metal pad, and a surface of the second die being level.

11. The device of claim 10, wherein the metal pad is supported by a build-up film layer.

12. The device of claim 11, wherein polymer ring comprises polybenzoxaxole (PBO), the build-up film layer comprises build-up film layer, and the metal pad comprises copper.

13. The device of claim 10, wherein a solder feature width is greater than a polymer ring width.

14. The device of claim 10, wherein a polymer ring width is greater than a metal pad width.

15. The device of claim 10, wherein the polymer ring is at least partially encapsulated by the molding compound and overhangs the metal pad in a horizontal direction.

16. The device of claim 10, wherein the polymer rings collectively form a symmetrical pattern when viewed from above.

17. A device comprising:
a die;
through vias adjacent the die;
an encapsulant along sidewalls of the die;
a first metal pad and a second metal pad extending into the encapsulant, the encapsulant contacting the die and the first metal pad along a line parallel to a major surface of the die, the major surface of the die not being covered by the encapsulant;
a first dielectric pattern over the first metal pad and a second dielectric pattern over the second metal pad, the encapsulant extending along sidewalls of the first dielectric pattern and the second dielectric pattern; and
a first conductive feature extending through the first dielectric pattern to the first metal pad and a second conductive feature extending through the second dielectric pattern to the second metal pad, the encapsulant extending along sidewalls of the first conductive feature and the second conductive feature, the encapsulant contacting the die and the first conductive feature along a line parallel to the major surface of the die.

18. The device of claim 17, wherein a lateral width of the first dielectric pattern is greater than a lateral width of the first metal pad.

19. The device of claim 17, wherein the first conductive feature and the second conductive feature comprises a solder feature.

20. The device of claim 17, wherein the first dielectric pattern and the second dielectric pattern are circular shaped.

* * * * *